US007354788B2

(12) United States Patent
Bar-Sadeh et al.

(10) Patent No.: US 7,354,788 B2
(45) Date of Patent: Apr. 8, 2008

(54) METHOD FOR PROCESSING A MEMS/CMOS CANTILEVER BASED MEMORY STORAGE DEVICE

(75) Inventors: Eyal Bar-Sadeh, Jerusalem (IL); Tsung-Kuan Chou, San Jose, CA (US); Valluri Rao, Saratoga, CA (US); Krishnamurthy Murali, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 400 days.

(21) Appl. No.: 11/168,195

(22) Filed: Jun. 28, 2005

(65) Prior Publication Data

US 2006/0289954 A1 Dec. 28, 2006

(51) Int. Cl.
*H01L 21/00* (2006.01)

(52) U.S. Cl. .......................................... 438/52; 438/50

(58) Field of Classification Search ............ 438/50–53
See application file for complete search history.

(56) References Cited

U.S. PATENT DOCUMENTS

| | | | | |
|---|---|---|---|---|
| 5,546,375 | A | 8/1996 | Shimada et al. | |
| 5,970,315 | A | 10/1999 | Carley et al. | |
| 6,835,589 | B2 * | 12/2004 | Pogge et al. | 438/52 |
| 2004/0150472 | A1 | 8/2004 | Rust | |

* cited by examiner

*Primary Examiner*—Cuong Nguyen
(74) *Attorney, Agent, or Firm*—Blakely, Sokoloff, Taylor & Zafman LLP

(57) ABSTRACT

A method is disclosed. The method includes fabricating microelectromechanical (MEMS) structures of a Seek and Scan Probe (SSP) memory device on a first wafer, and fabricating CMOS and memory medium components of the SSP memory device on a second wafer.

13 Claims, 8 Drawing Sheets

100
110
126
120
122
124
CMOS
130

METHOD FOR PROCESSING A MEMS/CMOS CANTILEVER BASED MEMORY STORAGE DEVICE

FIELD OF THE INVENTION

The present invention relates generally to memory device, more specifically, the present invention relates to processing a Seek and Scan Probe memory device.

BACKGROUND

Currently, there is a drive to implement Seek and Scan Probe (SSP) memory devices for memory applications. SSP devices include a top wafer made from silicon on insulator (SOI) that includes microelectromechanical (MEMS) cantilever beams mounted on a CMOS substrate. A cantilever beam accesses transistor storage devices on a bottom CMOS wafer. To access the storage devices the cantilever beams are constructed to move along the X-Y axis of the lower wafer.

A problem exists with SSP memory devices in that the process of manufacturing the top wafer is expensive. This is because MEMS and CMOS are processed on the wafer. Such a process exhibits low process yields.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A low cost silicon process flow to manufacture a Seek and Scan Probe (SSP) memory device is described. The SSP memory device includes an array of cantilever probe tips that write on a phase change memory medium. In one embodiment, the probe tips and positioning stage are fabricated on one wafer, while CMOS electronics and the phase change memory medium on top is fabricated on a second wafer. The two wafers are then bonded together and subsequently the probe wafer is ground back to release the moving platforms.

In one embodiment, existing CMOS process flow is utilized. In a further embodiment, the cantilevers are built with polysilicon, nitride and a top conducting metallic layer which (e.g., gold) on standard silicon wafers. According to one embodiment, a combination of ECR (Electron Cyclotron Resonance) silicon etching is used, followed by wafer backgrind to release moving X-Y stages. In yet another embodiment, MEMS structures are on one wafer, while the CMOS and memory medium are on the second wafer.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
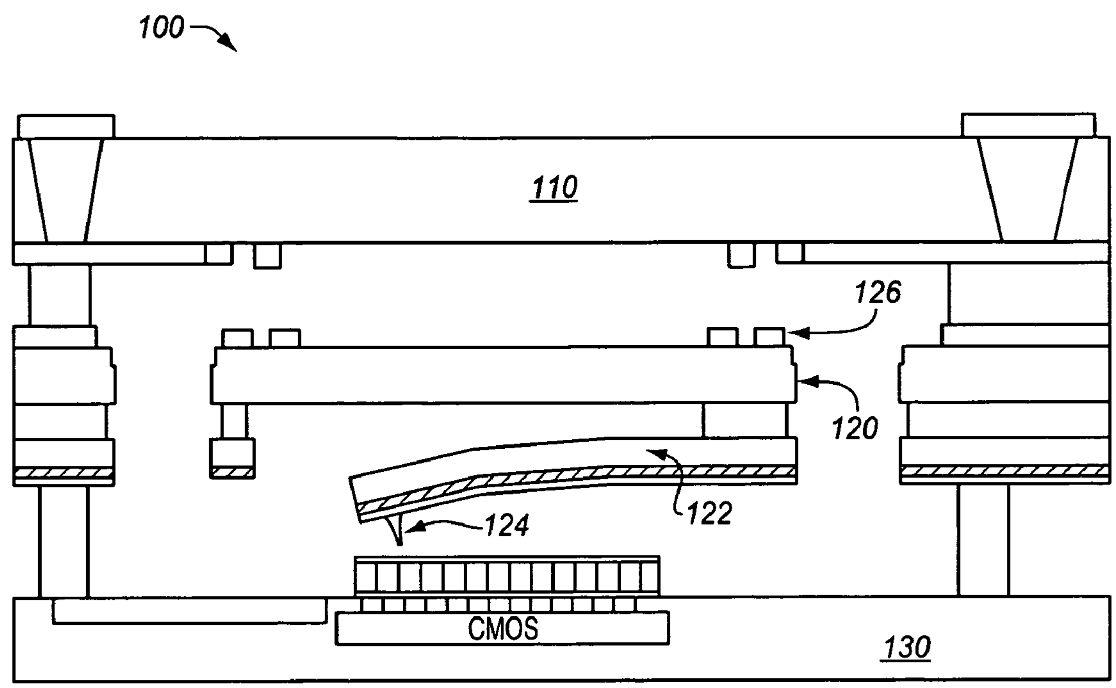
FIG. 1 illustrates one embodiment of a Seek and Scan Probe (SSP) memory device.

FIG. 1 illustrates a cross-section of one embodiment of a SSP memory device 100. Device 100 includes a cover wafer 110, a MEMS moving part 120 and a CMOS wafer 130. Cover wafer 110 encapsulates MEMS moving part 120. Cover wafer 110 includes through vias to route I/O and power to/from MEMS moving part 120. In addition, metal lines are included to serve as stator for a Vernier drive.

MEMS moving part 120 includes set of polysilicon cantilever beams 122 with sharp tips 124. According to one embodiment, MEMS moving part 120 is held by springs to facilitate movement in the X-Y directions. Vernier driver metal fingers 126 are located at the other side of the MEMS wafer. CMOS wafer 130 is the electronic wafer that includes control circuits and CMOS transistors for memory storage. When accessing a storage device at CMOS wafer 130, a tip 124 of a cantilever 122 contacts the device, making an electrical connection.

Figure 2:
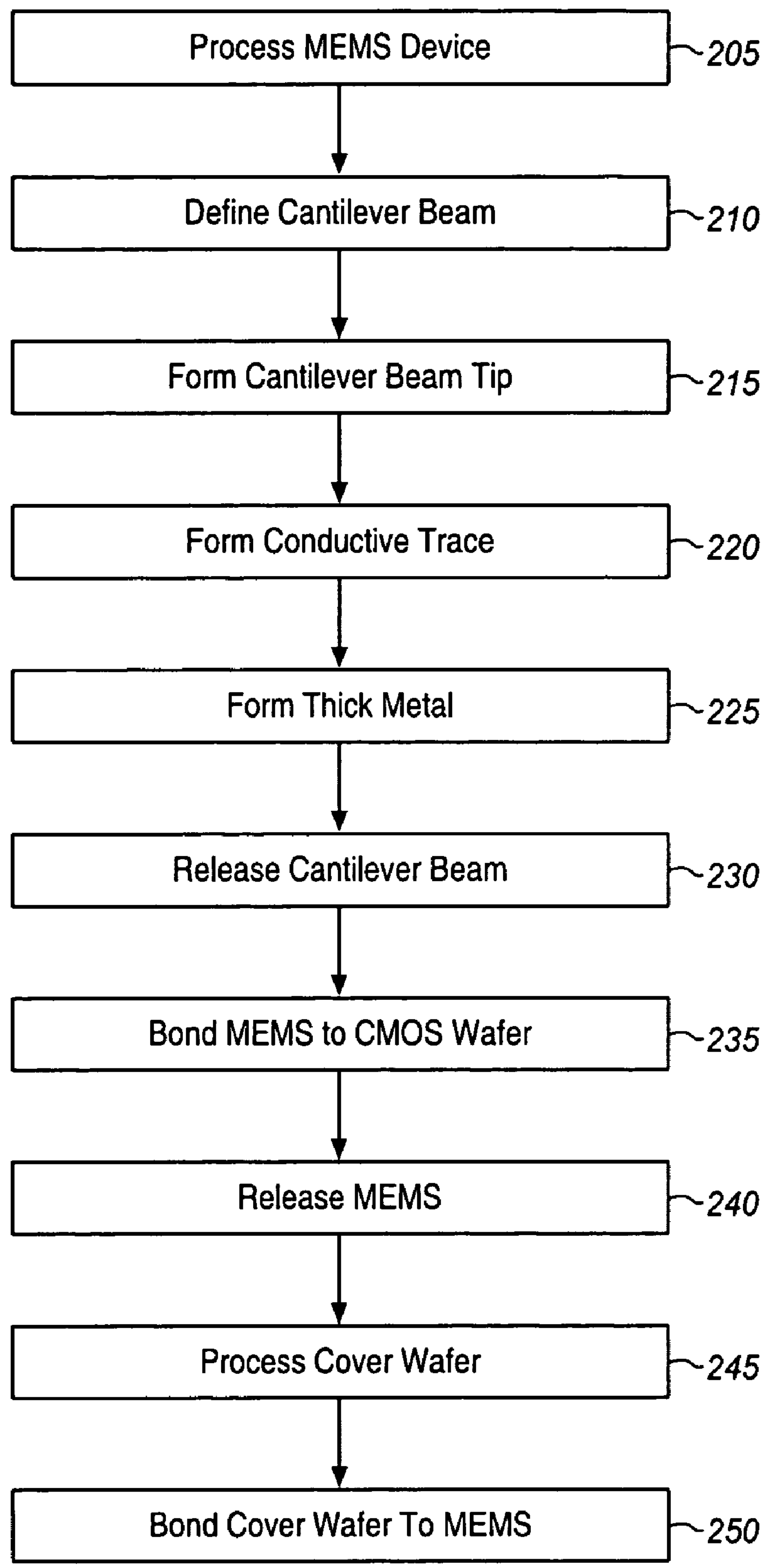
FIG. 2 is a flow diagram illustrating one embodiment of processing a SSP memory device.

FIG. 2 is a flow diagram illustrating one embodiment of processing SSP memory device 100. At processing block 205, processing of MEMS moving part 120 is initiated. The process includes depositing oxide (e.g., thermal oxide or CVD SiO2,) of approximately 2 um on a silicon wafer via sacrificial oxide deposition.

Figure 3:
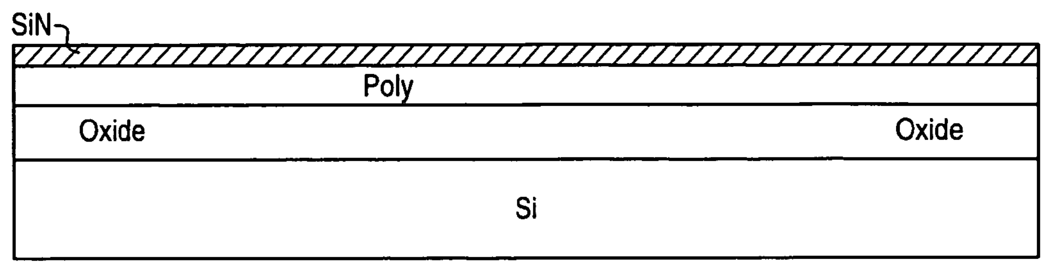
FIG. 3 illustrates one embodiment of a process flow for a SSP memory device.

Next, a first polysilicon layer (approximately 5000 A) is deposited over the oxide layer. In one embodiment, an optional implant into the polysilicon layer may be conducted for conductivity and stress control. Finally, Low Pressure Chemical Vapor Deposition (LPCVD) of silicon nitride is layered over the polysilicon. The silicon nitride layer is implemented for stress control to tune the cantilevers for bending at a predetermined angle. FIG. 3 illustrates one embodiment of the process flow for the device 100 after LPCVD.

Figure 4:
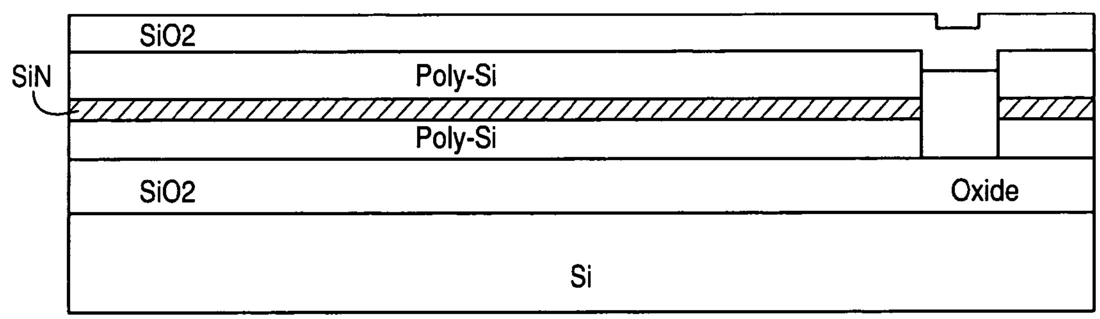
FIG. 4 illustrates another embodiment of a process flow for a SSP memory device.

Referring back to FIG. 2, the cantilever beams are defined at processing block 210. This process includes applying a lithography mask over the silicon nitride layer. Subsequently, the silicon nitride and polysilicon layers are etched via reactive ion etching (RIE). Next, a second thin layer of oxide is deposited via Chemical Vapor Deposition (CVD). A second polysilicon layer is then deposited. This layer is used to form the tip of the cantilevers. Finally, an oxide mask is deposited over the second polysilicon layer via CVD. FIG. 4 illustrates one embodiment of the process flow for the device 100 after CVD of the oxide mask.

Figure 5:
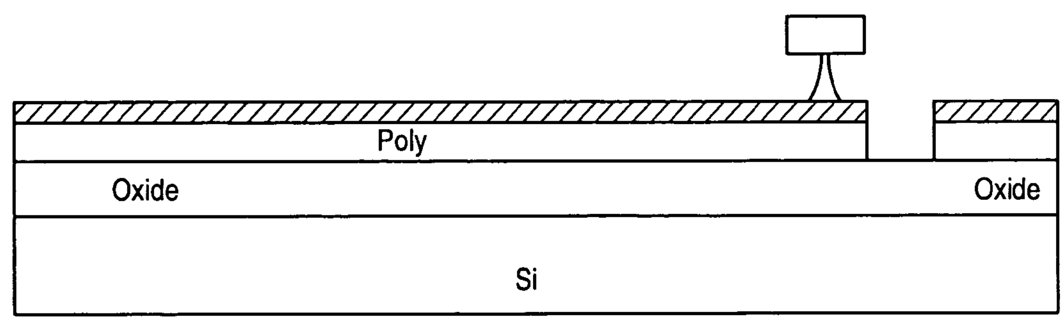
FIG. 5 illustrates yet another embodiment of a process flow for a SSP memory device.

Referring back to FIG. 2, the tip of the cantilever beams are formed at processing block 215. First, a second lithography mask is deposited over the oxide mask. The polysilicon layer is subsequently etched via a hard mask etch (e.g., RIE or hydrogen fluoride (HF) based wet etch). This process forms a sharp polysilicon tip under the oxide. Next, a poly anisotropic etch is performed, followed by a sharpening oxidation. FIG. 5 illustrates one embodiment of the process flow for the device 100 after sharpening oxidation.

Figure 6:
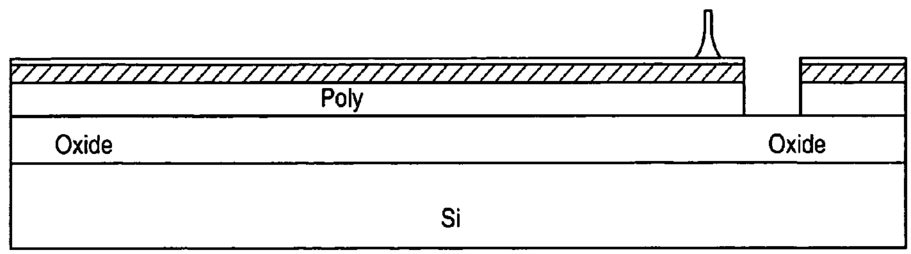
FIG. 6 illustrates still another embodiment of a process flow for a SSP memory device.

Referring back to FIG. 2, metal is deposited and patterned to form a conductive trace at processing block 220. This process begins with an etch of the oxide mask layer. Next, a thin metal layer is deposited over the polysilicon layer. A metal lithography process is performed, followed by a metal etch. FIG. 6 illustrates one embodiment of the process flow for the device 100 after the metal etch is performed.

Figure 7:
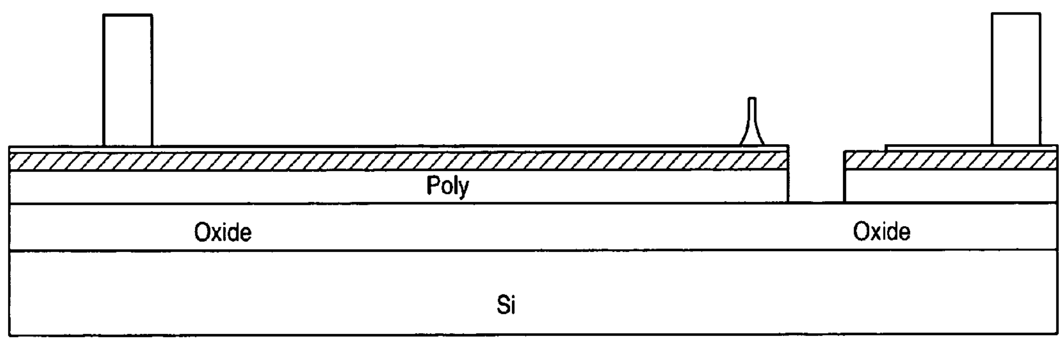
FIG. 7 illustrates another embodiment of a process flow for a SSP memory device.

Referring back to FIG. 2, thick metal is formed on the thin metal layer at specific locations, processing block 225. To form the thick metal, a resist coating and pattern process is performed. A metal seed sputter is then performed, followed by a mold resist coat. Next, a metal e-plating process is completed. Finally, the mold is removed, the seed is etched and the resist coat is stripped. FIG. 7 illustrates one embodiment of the process flow for the device 100 after the thick metal posts are formed.

Figure 8:
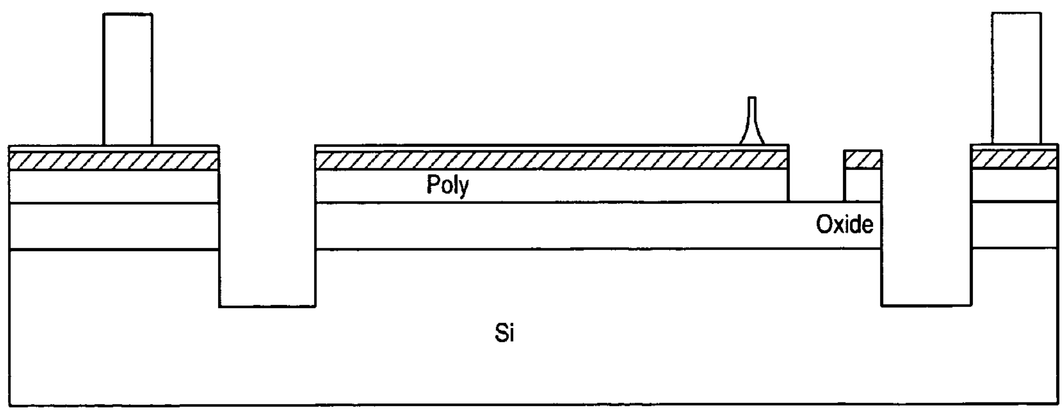
FIG. 8 illustrates another embodiment of a process flow for a SSP memory device.

Referring back to FIG. 2, the cantilevers are released, processing block 230. First, trenches are formed to initiate the release of the cantilevers, this process involves performing an etch (e.g., dry etch) of portions of the silicon nitride layer adjacent to the thick metal posts to form trenches. Subsequently, the exposed portion of the polysilicon layer is dry etched. The exposed oxide layer is then dry etched, followed by a dry etch of the silicon layer. According to one embodiment, the silicon layer is etched to a depth of 50 μm. FIG. 8 illustrates one embodiment of the process flow for the device 100 after the trenches adjacent to the cantilever have been formed.

Figure 9:
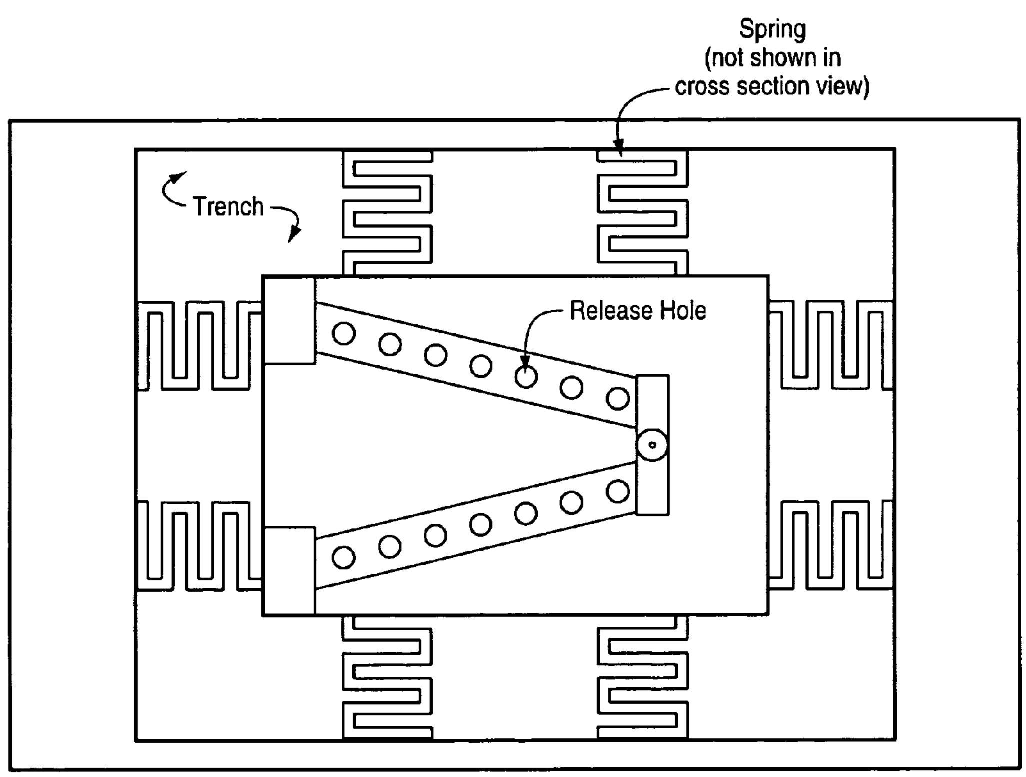
FIG. 9 illustrates a top view of one embodiment a process flow for a SSP memory device.

FIG. 9 illustrates a top view of one embodiment of device 100 after completion of the process shown in FIG. 8. As shown in FIG. 9, springs are included on each side of the cantilever beam. The springs are used to later attach moving part 120 to other components of device 100 to facilitate movement of device 100 in the X-Y directions.

Figure 10:
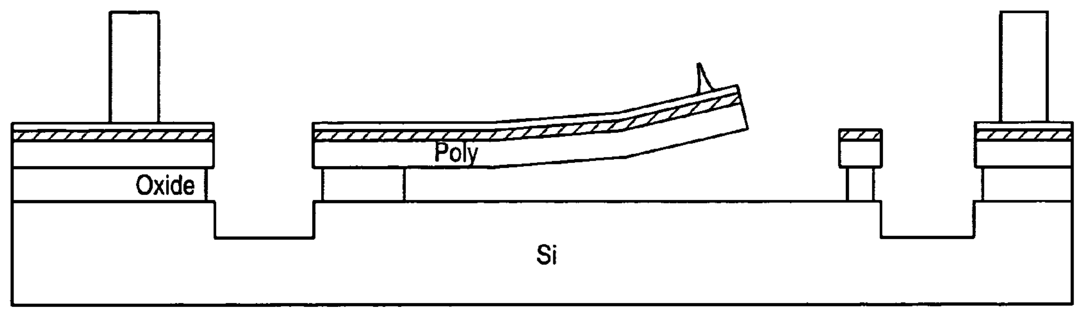
FIG. 10 illustrates one embodiment of a process flow for a SSP memory device.

Referring back to FIG. 2, the oxide layer underneath the polysilicon layer in the cantilever is control etched in order to release the cantilever. FIG. 10 illustrates one embodiment of the process flow for the device 100 after the cantilever has been released. As shown in FIG. 10, the cantilever currently is supported by a small portion of oxide opposite of the tip.

Figure 11:
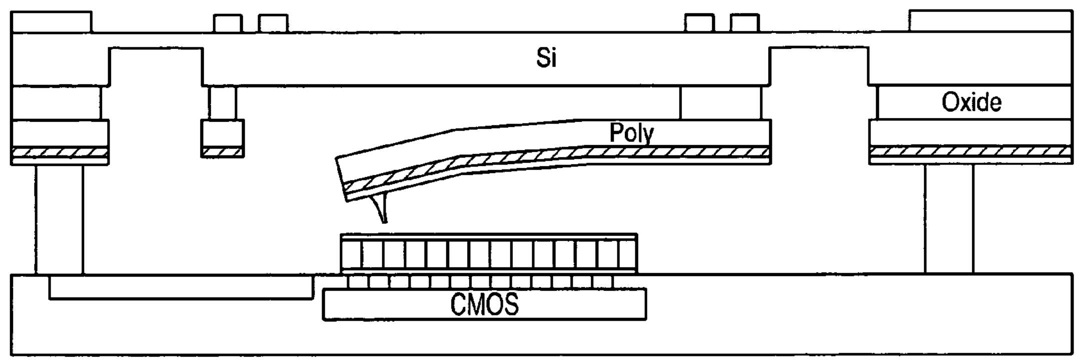
FIG. 11 illustrates another embodiment of a process flow for a SSP memory device.

Referring back to FIG. 2, the MEMS wafer is flipped and bonded to CMOS wafer 130 at the thick metal posts, processing block 235. Subsequently, the MEMS wafer undergoes a grinding process. Afterwards, metal is sputtered on the silicon layer of the MEMS, and metal lithography and etching is performed. The metal sputter, lithography and etching processes forms the Vernier driver metal fingers used to route I/O. FIG. 11 illustrates one embodiment of the process flow for the device 100 after the MEMS wafer is bonded to the CMOS wafer, and the metal fingers are formed.

Figure 12:
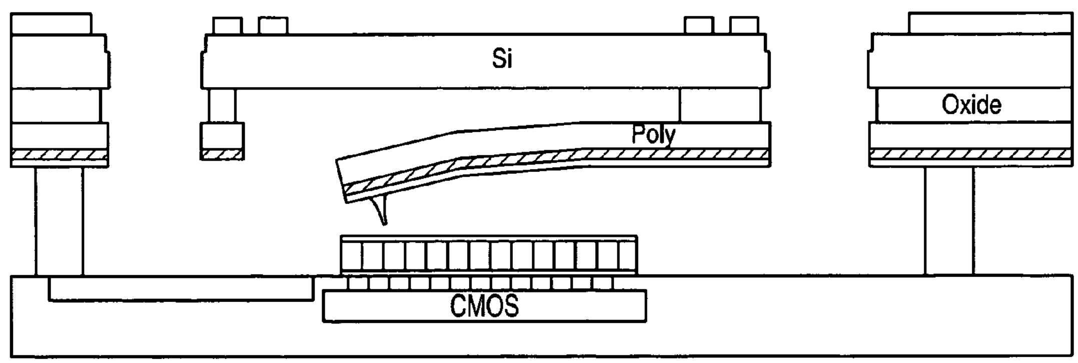
FIG. 12 illustrates yet another embodiment of a process flow for a SSP memory device.
Figure 13:
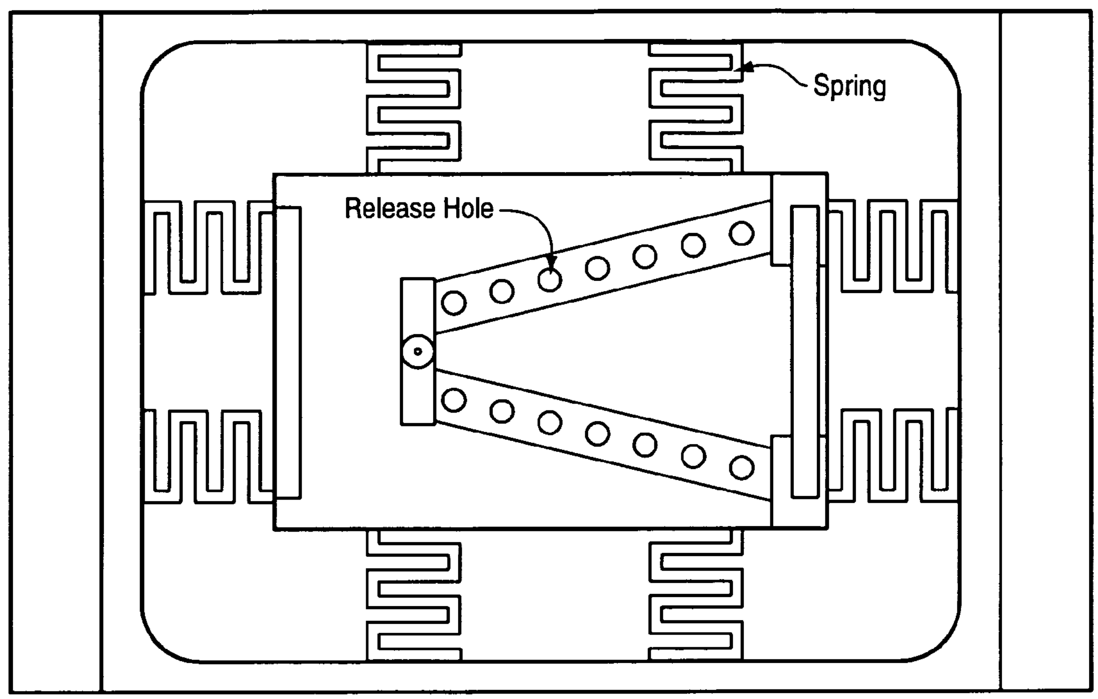
FIG. 13 illustrates a top view of one embodiment a process flow for a SSP memory device.

Referring back to FIG. 2, the MEMS wafer is released to form the moving part 120 at processing block 240. According to one embodiment, this process is implemented via silicon dry etching. FIG. 12 illustrates one embodiment of the process flow for the device 100 after the MEMS wafer has been released. At this stage the moving part 120 is held by the springs (not shown) that enable movement at the lateral direction. Note that the springs are rigid in the vertical direction. FIG. 13 illustrates a top view of one embodiment of device 100 after completion of the process shown in FIG. 12. As shown in FIG. 13, the springs couple moving part 120 to the side structure of the MEMS wafer.

Referring back to FIG. 2, cover wafer 110 is processed, processing block 245. To process cover wafer 110, silicon nitride is deposited over a silicon wafer. Gold is then sputtered over the silicon nitride, followed by gold lithography and etching. Next, a resist spin and pattern is performed to generate bonding studs. Subsequently, a seed sputter is performed. Gold plating is then performed followed by mold resist strip and seed etching.

Figure 14:
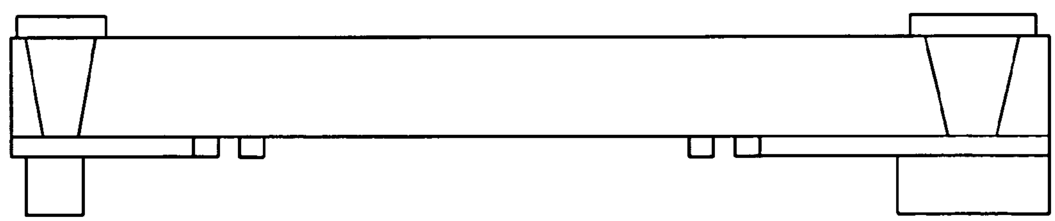
FIG. 14 illustrates one embodiment of a process flow for a cover wafer.

The cover wafer is subsequently flipped upside down. The wafer then undergoes via lithography and a nitride etch. Next, potassium hydroxide silicon etching is performed. Finally, a metal sputter is deposited, followed by metal lithography and etching. FIG. 14 illustrates one embodiment of the cover wafer 110 after it has been formed.

Referring back to FIG. 2, cover wafer 110 is bonded to the MEMS wafer, processing block 250. Subsequent to the bonding, memory device 100 has been completed, as shown in FIG. 1 above.

Figure 15:
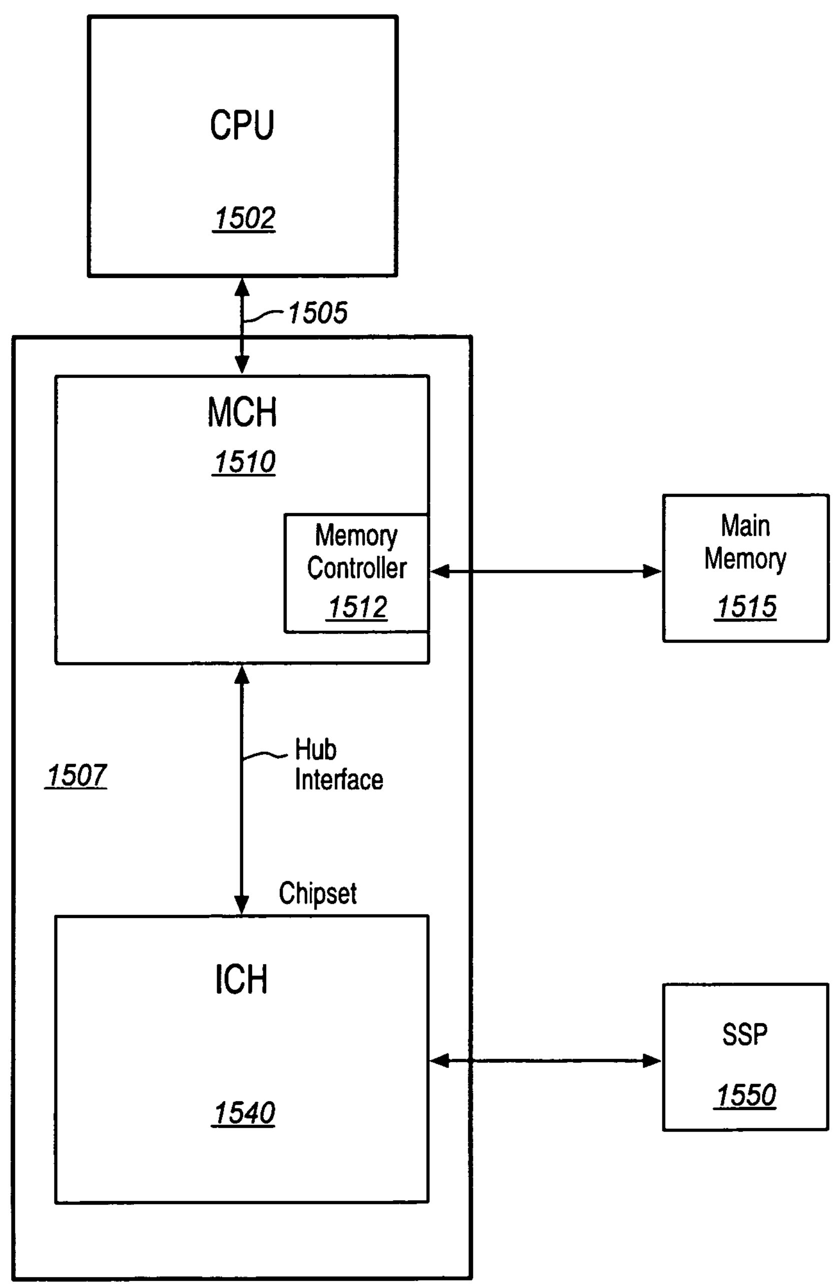
FIG. 15 illustrates one embodiment of a computer system.

FIG. 15 illustrates one embodiment of a computer system 1500 in which memory device 100 may be implemented. Computer system 1500 includes a central processing unit (CPU) 1502 coupled to an interface 1505. In one embodiment, CPU 1502 is a processor in the Pentium® family of processors Pentium® IV processors available from Intel Corporation of Santa Clara, Calif. Alternatively, other CPUs may be used.

In a further embodiment, a chipset 1507 is also coupled to interface 1505. Chipset 1507 includes a memory control hub (MCH) 1510. MCH 1510 may include a memory controller 1512 that is coupled to a main system memory 1515. Main system memory 115 stores data and sequences of instructions that are executed by CPU 102 or any other device included in system 100. In one embodiment, main system memory 1515 includes dynamic random access memory (DRAM); however, main system memory 1515 may be implemented using other memory types (e.g., an SSP memory device). Additional devices may also be coupled to interface 1505, such as multiple CPUs and/or multiple system memories.

MCH 1510 is coupled to an input/output control hub (ICH) 1540. ICH 1540 provides an interface to input/output (I/O) devices within computer system 1500. According to one embodiment, a SSP memory device 1550 is coupled to ICH 1540.

The above-described process for manufacturing a SSP memory device feature cantilever beams built with polysilicon, nitride and a top conducting metallic layer (e.g., gold) on standard silicon wafers as opposed to doped single crystal cantilevers made from SOI wafers.

Further, a combination of ECR (Electron Cyclotron Resonance) silicon etching is used, followed by wafer backgrind to release moving X-Y stages in order to avoid the expensive and time consuming process of deep RIE etching process commonly used to release such high aspect ratio structures. Another feature is that all MEMS structures are on one wafer, while the CMOS and memory medium are on a second wafer. This eliminates a mix and match of MEMS and CMOS processing, greatly improving yield and reduces overall cost.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. A method comprising:
- fabricating microelectromechanical (MEMS) structures of a Seek and Scan Probe (SSP) memory device on a first wafer; and
- fabricating CMOS and memory medium components of the SSP memory device on a second wafer.

2. The method of claim 1 further comprising bonding the first wafer and the second wafer.

3. The method of claim 2 further comprising grinding the first wafer.

4. The method of claim 3 further comprising etching the first Wafer to form a MEMS moving part.

5. The method of claim 4 further comprising fabricating a cover wafer to enclose the MEMS moving part.

6. The method of claim 5 further comprising bonding the cover wafer to the second wafer.

7. The method of claim 1 wherein fabricating the first wafer comprises:
- depositing a first polysilicon layer over an oxide layer; and
- layering silicon nitride over the first polysilicon layer.

8. The method of claim 7 further comprising a process of defining cantilever beams on the first wafer, including:
- applying a lithography mask over the silicon nitride layer;
- etching the silicon nitride and polysilicon layers;
- depositing a second thin layer of oxide;
- depositing a second polysilicon layer; and
- depositing an oxide mask over the second polysilicon layer.

9. The method of claim S further comprising a process of forming the tip of the cantilever beams on the first wafer, including:
- depositing a second lithography mask over the oxide mask;
- etching the polysilicon layer to form a sharp polysilicon tip under the oxide;
- performing a poly anisotropic etch; and
- performing a sharpening oxidation.

10. The method of claim 9 further comprising a process of fanning one or more conductive traces on the first wafer, including:
- etching the oxide mask layer;
- depositing a thin metal layer over the polysilicon layer;
- performing a metal lithography process; and
- performing a metal etch.

11. The method of claim 10 Thither comprising a process of forming a thick metal on the first wafer, including:
- performing a resist coating and pattern process;
- performing a metal seed sputter;
- performing a mold e-plating process;
- removing mold;
- etching the seed; an
- stripping the resist coat.

12. The method of claim 11 further comprising a process of releasing the cantilever beams, including:
- forming trenches to initiate the release of the cantilever beams by performing an etch of portions of the silicon nitride layer;
- etching exposed portions of the polysilicon layer
- etching the exposed oxide layer; and
- etching the silicon layer.

13. The method of claim 12 flitter comprising etching the oxide layer underneath the polysilicon layer to release the cantilever.

* * * * *

UNITED STATES PATENT AND TRADEMARK OFFICE

CERTIFICATE OF CORRECTION

PATENT NO. : 7,354,788 B2 
APPLICATION NO. : 11/168195 
DATED : April 8, 2008 
INVENTOR(S) : Bar-Sadeh et al.

It is certified that error appears in the above-identified patent and that said Letters Patent is hereby corrected as shown below:

In column 6, at line 4, delete “S” and insert --8--.
In column 6, at line 20, delete “Thither” and insert --further--.

Signed and Sealed this

Eighteenth Day of November, 2008

JON W. DUDAS
*Director of the United States Patent and Trademark Office*